United States Patent [19]

Gray et al.

[11] Patent Number: 4,719,601

[45] Date of Patent: Jan. 12, 1988

[54] COLUMN REDUNDANCY FOR TWO PORT RANDOM ACCESS MEMORY

[75] Inventors: Kenneth S. Gray, Underhill; Bradley D. Herrman, Williston, both of Vt.

[73] Assignee: International Business Machine Corporation, Armonk, N.Y.

[21] Appl. No.: 858,989

[22] Filed: May 2, 1986

[51] Int. Cl.$^4$ ............................................. G11C 13/00
[52] U.S. Cl. .................................... 365/210; 365/189; 365/238
[58] Field of Search ................ 365/189, 182, 210, 238

[56] References Cited

U.S. PATENT DOCUMENTS 3,763,480 10/1973 Weimer ................................ 365/238

Primary Examiner—Terrell W. Fears
Attorney, Agent, or Firm—Sughrue, Mion, Zinn, Macpeak & Seas

[57] ABSTRACT

A memory system includes a data storage matrix having columns and rows and a redundant storage matrix having at least one column. The columns of the storage matrix are addressed by column addresses each defining a logical column address for a data bit of a row and corresponding to a predetermined physical column of the storage matrix. The storage matrix is readable in parallel, the parallel read data being serially presented to an output port in a sequence determined by the physical order of the columns of the storage matrix. Column redundancy logic, response to a column address corresponding to a defective physical column of the storage matrix, stores a data bit in a column of the redundant storage matrix. Redundancy control logic response to the column redundancy logic operates on data parallel read from the storage matrix by column addressing, to insert the data bit stored in the redundant column between the data bits read from the data storage matrix according to its logical column address.

8 Claims, 4 Drawing Figures

COLUMN REDUNDANCY FOR TWO PORT RANDOM ACCESS MEMORY

BACKGROUND OF THE INVENTION

The invention relates to two port random access memories, RAMs, wherein data stored by row and column addresses are read from or written into the RAM serially through one of the two ports by physical column sequential transferring.

Random access memories having a second input/output (I/O) port have been used in mapped raster display apparatus to provide data from a random access memory, such as a dynamic random access memory, DRAM, to form a CRT image on a display which has a finite decay time before the image will fade. In such an application, a continuous data stream must be read from the memory in order to keep the display refreshed.

It is also conventional to write data through the second input/output port to the DRAM. As will be explained in greater detail hereinafter, such a random access memory is usually provided with at least one internal row buffer register which can transfer an entire row of data from the second input/output port to the RAM or transfer an entire row of data from the RAM to the second input/output port.

The DRAM stores an electrostatic charge on a capacitor at the intersection of each row and column to represent a binary number bit which is to be stored. WRITE and READ circuits are provided to access each capacitor element and apply the proper charge to the capacitor element for representing a binary 1 or 0. The capacitor elements are addressed by a plurality of row address bits and a plurality of column address bits supplied to the memory. The DRAM requires a refresh operation to maintain the proper electrostatic charge on the capacitor. The clock and address structure for the DRAM provides for periodic refresh of the column, typically every two to four milliseconds in response to an externally applied signal. The external signals applied to a DRAM include the row address signal, RAS, and the column address signal, CAS. The random access memory provides in response to these externally applied signals, a recharge function and timing signals for addressing each memory cell in response to an additionally supplied address signal. A first input/output port, I/O, receives and delivers data in response to a WRITE and READ command, respectively, also applied externally to the DRAM.

When the DRAM is used as a display random access memory in a mapped raster display apparatus, the display refresh function for refreshing the CRT image interferes with the updating of the memory data by usurping the input/output port at which time no new data may be stored. Therefore, updating a real time display using a mapped raster technique becomes difficult because of the limitation imposed from time sharing of the memory between updating information to be written into the memory and reading out data for refresh of the display.

The limitations imposed on memory usage by virtue of all traffic passing to the memory through a single input/output port have been eliminated with the advent of the two port random access memory. Such a memory is described in U.S. Pat. No. 4,541,075 which issued on Sept. 10, 1985 to Dill et al and which is assigned to the assignee of the instant application.

FIG. 1 represents a conventional two port random access memory such as described in the aforementioned Dill et al patent. The random access memory is provided with an internal row buffer register 25 which can transfer a row of data to and from the DRAM cells forming the matrix 11. The row buffer registers are connected to extensions of the column bit lines from the bi-directional sense amplifiers 17 of the RAM to transfer rows of data in parallel. A second input/output port 24 is provided on the RAM chip to serially receive the row buffer register contents or data to be written through buffer register 25 to the DRAM cells upon receipt of appropriate external pulse signals when a serial mode is selected. When a row is addressed and a READ operation is desired, a READ transfer pulse is applied to terminal 26 from a source external to the RAM, to transfer the row word to the row buffer register 25. A subsequent signal applied to the row buffer shift register will clock the contents of the register to a second input/output port 24 in the sequence determined by the physical column sequence.

The memory as depicted in FIG. 1 may advantageously be used in a bit mapped display device as the result of the block transfer of data into the row buffer register 25. The second input/output port 24 is then used to supply the refresh information necessary to maintain the CRT display refreshed. The primary output port 23 may therefore be used to update the memory with the new pixel data for later display without incurring delays from tying up the primary input/output port with refresh information for the display. In addition, the updating of the display memory contents in the main memory while refreshing the display from the row buffer will not result in interference problems for the image.

The two port random access memory may, of course, also be used to drive other types of output devices such as printers, disks and communications peripheral equipment. Additionally, as discussed in the aforementioned Dill et al patent, the two port random access memory may permit not only the reading out of data through the second input/output port but may also permit the writing of data through the second port to the memory cells.

As illustrated in FIG. 1, conventional two port RAMS wire extensions of the bit lines of the matrix array 11 to stages of the row buffer 25. That is, each bit line is physically extended and routed to a single shift register stage of the row buffer. This creates a fixed relationship between the primary port addressing and the secondary port shift position. The arrangement precludes the use of column redundant RAMS in a two port RAM wherein data is read or written serially through the secondary input/output port by physical column sequential accessing.

Column redundancy is a conventional technique for producing fault tolerant RAMS thus increasing RAM chip yields. During manufacturing, defective bit lines and associated memory cells are made unselectable by altering the RAM chip's internal addressing. Various techniques are known for altering the chip's internal addressing. Address modification may, for example, be accomplished with a polysilicone fuse scheme. The modified addressing points to a spare or redundant column and its associated bit line whenever the original defective bit line is externally addressed. Invoking column redundancy alters the serial data at the secondary output port in response to physical column sequential accessing. The present invention overcomes this limitation on the use of a column redundant random access memory in a two port RAM.

SUMMARY OF THE INVENTION

It is an object of the invention to provide a two port random access memory with a matrix array and redundant columns, to store data bits at predetermined logical column addresses, each logical column address having a predetermined relationship to a physical column of the matrix array, and to provide means for maintaining the data during a serial read or write operation in a sequence according to its predetermined logical column addresses notwithstanding storage of data bits in redundant columns.

This and other objects that will become apparent from the following detailed description of the preferred embodiments of the invention are accomplished in a random access memory with a column redundancy feature by providing control logic responsive to predetermined column address signals signaling storage of data bits at redundant columns for causing data accessed from the redundant columns to be presented to the secondary input/output port in the sequential column position corresponding to the logical column address of the data and for causing data presented to the second input/output part in sequential column positions according to the logical column address, to be written to redundant columns when column redundancy is invoked.

DETAILED DESCRIPTION OF THE PREFERRED EMBODIMENTS

Figure 1:
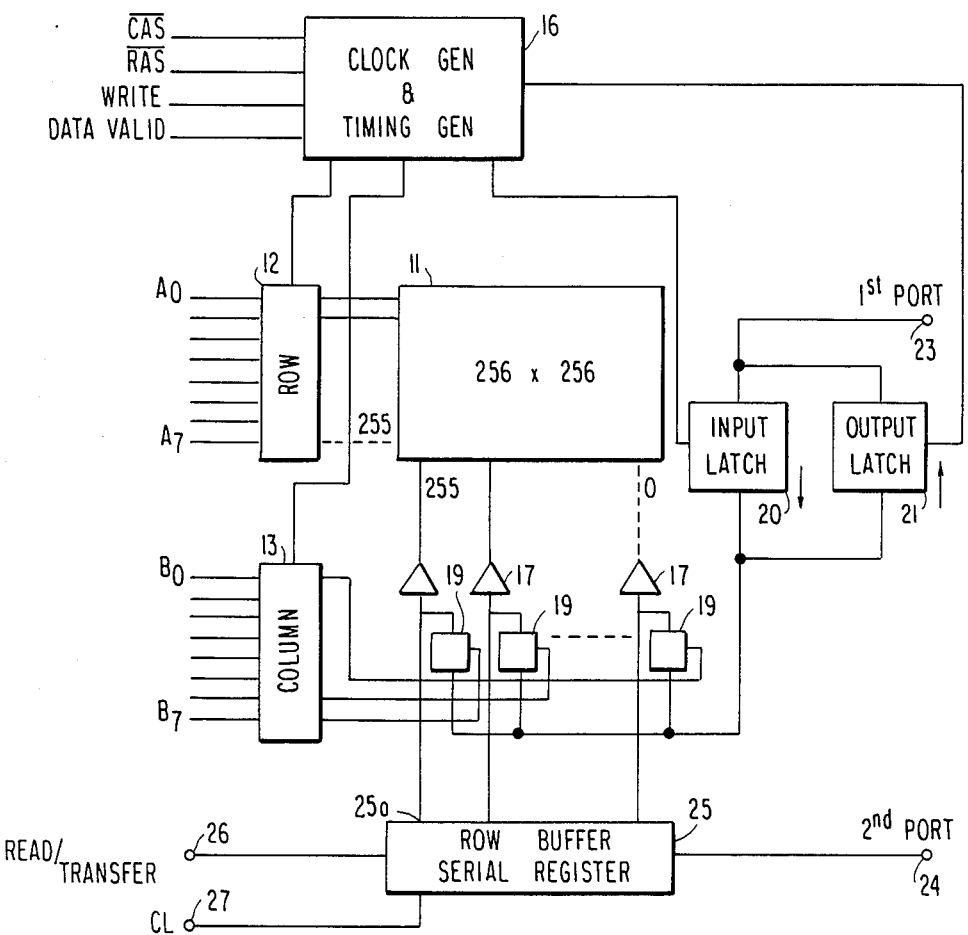
FIG. 1 illustrates a conventional two port random access memory with an internal row buffer.
Figure 2:
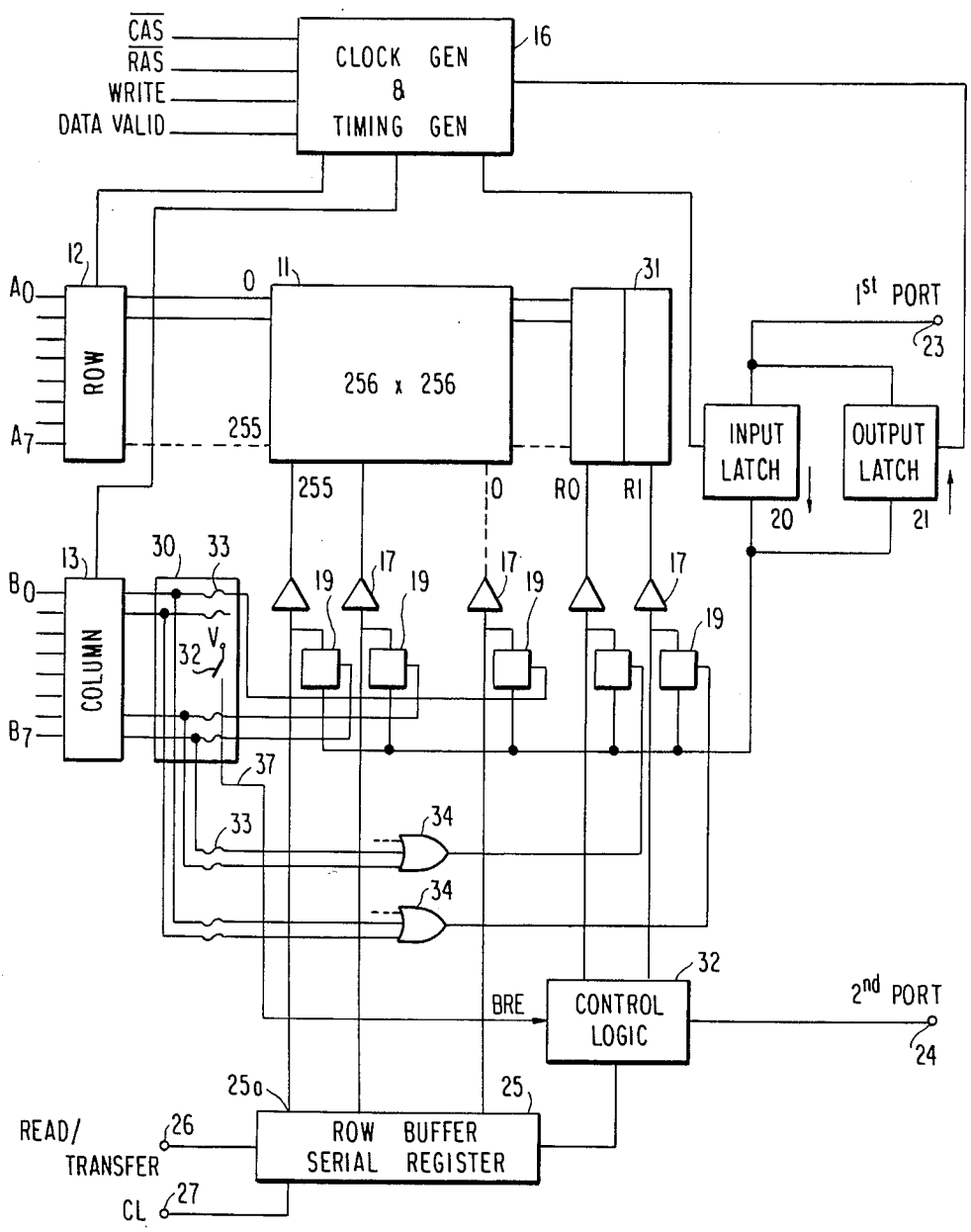
FIG. 2 illustrates a two port random access memory as illustrated in FIG. 1 modified with redundant columns and control logic according to the teachings of the present invention for maintaining the logical column addresses of the data during serial read out or write in notwithstanding storage of data in redundant columns.

The random access memory of FIG. 2 corresponds to the conventional random access memory of FIG. 1 modified in accordance with the teachings of the present invention to permit the use of redundant columns while maintaining the required logical column addresses of the data transferred through the row buffer 25 during serial transfer of the data through the second port 24.

More specifically, the conventional portion of the random access memory includes a matrix 11 of memory cells. In the memory of FIGS. 1 and 2, a 256 by 256 matrix array is illustrated. A clock generator and timing generator 16 provides the internal clocking signal to decode the matrix 11, and latch information to and from the I/O port 23 through the input latch 20 and output latch 21. A plurality of bi-directional sense amplifiers 17 connected one to each column bit line provides an output signal on its respective bit line. Output signals from the sense amplifiers represent the data stored in the addressed row. A row decoder 12 is employed to receive the row address data on lines A0 through A7 and apply appropriate decoding signals to the matrix 11 in response to a row address signal RAS. A column decoder 13 receives column address data on lines B0 through B7 and will enable gates 19 connected to respective sense amplifiers 17 to enable each sense amplifier to decode one bit of the addressed column.

The row buffer shift register 25 has parallel inputs connected to extensions 25a of the bit lines from the sense amplifiers 17 to receive the data from each of the sense amplifiers and to transfer data to sense amplifiers. While there are shown only three sense amplifiers connected to the matrix 11, in a 256 by 256 matrix 256 there would, of course, be 256 sense amplifiers and 256 stages of the row buffer serial register. To read from the row buffer 25, a READ/TRANSFER signal is applied to the row buffer through terminal 26 while clock signals are applied to the row buffer at terminal 27. With data from a row of the matrix 11 in the row buffer 25, a READ/TRANSFER signal to terminal 26 and clock signals to terminal 27 cause the contents of the row buffer to be sequentially transferred to the second port 24.

The random access memory of FIG. 2 differs from the memory of FIG. 1 in the following respects. A redundant data storage matrix 31 is provided. It is illustrated as having two columns but of course it may have any number of columns. Each column of the redundant data storage matrix 31 is connected to a bi-directional sense amplifier 17, the sense amplifier being connected to a gate 19 in the manner that the sense amplifiers in the columns of the matrix array 11 are connected to respective gates 19. An internal addressing modifying circuit 30 is programmable to modify the physical column address corresponding to a logical column address so that data may be stored in a redundant column R0, R1 when the physical column in matrix 11 corresponding to a given logical column address is defective. In a simple implementation of the internal addressing modifying circuit 30, fuses 33 are selectively blown to provide proper routing of the column address signals. OR gates 34 may be used to combine the outputs from the internal addressing modifying circuit 30 into two output groups and connect each group to one of columns R0 or R1. Other known wiring arrangement for connecting the redundant line outputs of the internal addressing modifying circuit 30 to redundant columns may also be used. As should be apparent, the arrangement of FIG. 2 allows for two defective columns in array 11 to be replaced with two redundant columns. As mentioned previously herein, additional redundant columns may be used.

In conventional random access memories with column redundancy, once column redundancy is selected during the manufacturing process, the internal addressing modifying circuit 30 is set to issue a bit redundancy enable, BRE, signal. This capability is represented in FIG. 2 by the source V connected through switch 32 to electrical line 37. When column redundancy is selected, switch 32 is closed at time of manufacture to connect line 37 to source V. Therefore, the BRE signal is always present when power is supplied to the random access memory. The BRE signal is input to control 32 for the purpose discussed in detail hereinafter with reference to FIGS. 3 and 4.

The control logic 32 operates to insert a redundant column bit into its proper logical column address position during the sequential read out of the row buffer 25 to the second input/output port 24 or write into the row buffer from port 24. While the following detailed description of the invention refers to the reading out of data from the row buffer 25 to the second input/output port 24, it should be apparent to those skilled in the art that the control logic 32 is also functional to arrange data received at port 24 in a logical column address sequence according to the physical column addresses designated when column redundancy is selected.

Returning to the operation of the control logic 32 during read out, it assures that even when data bits are stored in redundant columns the sequence of the data bits read from the second port 24 is the same as it would be if none of the columns of matrix array 11 were defective and all bits were stored in the array 11. Operation of the column redundancy control logic 32 may be better understood with reference to FIGS. 3 and 4 which illustrate two preferred embodiments of the control logic. It is to be understood, however, applicant's invention is not to be limited to the preferred embodiments illustrated in FIGS. 3 and 4.

Figure 3:
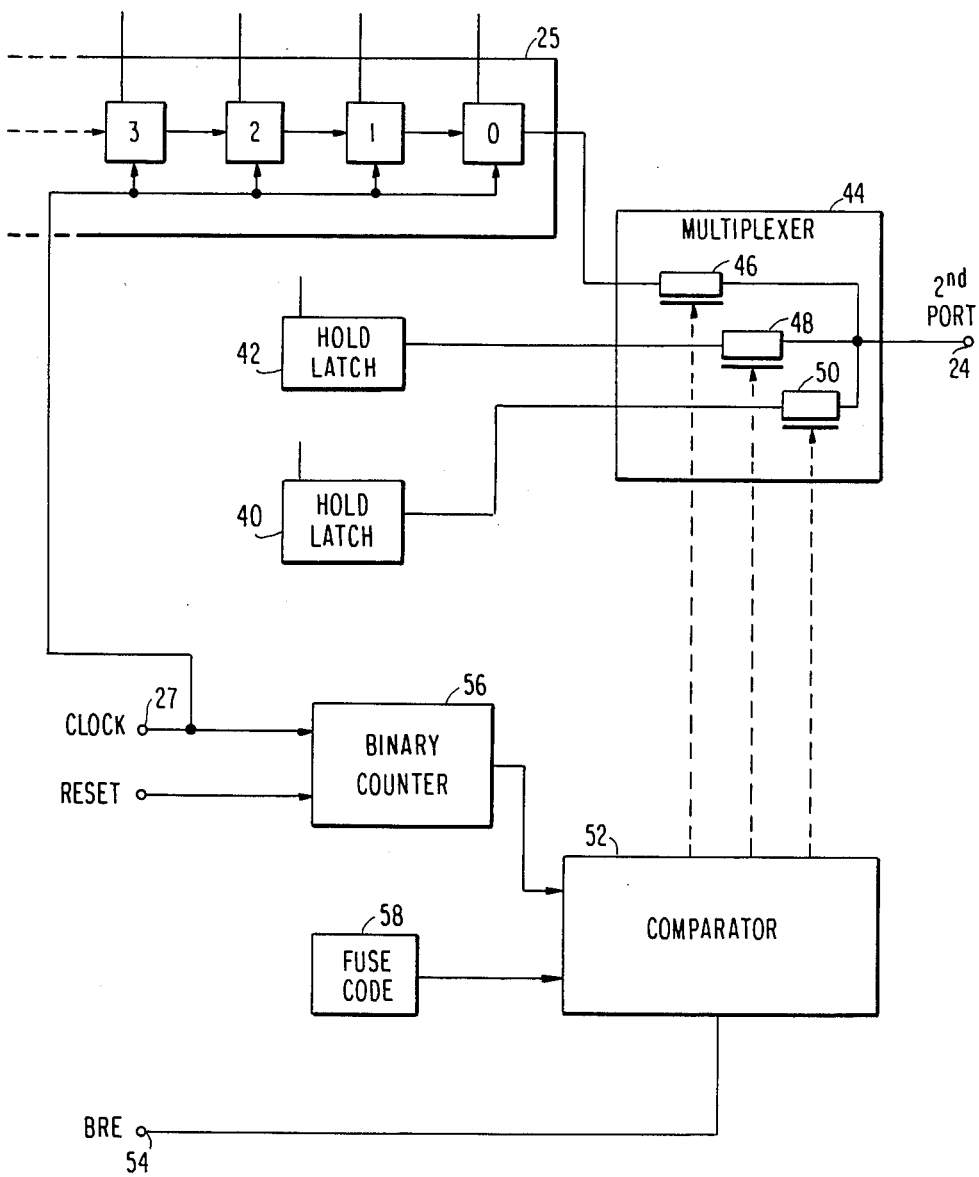
FIG. 3 illustrates one embodiment of the control logic of the instant invention.

FIG. 3 illustrates a portion of the row buffer 25, specifically four shift register stages of that buffer, and control logic 32. The control logic includes hold latches 40, 42 connected to extensions of the bit lines passing from the sense amplifiers 17 associated with the two redundant columns R0 and R1. The hold latches 40, 42 are connected to a multiplexer 44 which is comprised of gating devices 46, 48 and 50. The gates 46, 48 and 50 are enabled by outputs of a comparator 52. The comparator is enabled by the bit redundancy enable, BRE, signal applied to terminal 54 of the control logic. One input to the comparator 52 is from a binary counter 56 which is responsive to the clock signals at terminal 27 and identifies the columns addressed during the serial read out of the buffer 25. A second input to the comparator 52 is from a fuse code logic circuit 58 which identifies the defective bit lines in the matrix array 11.

With this arrangement, the output of the buffer shift register 25 and the output of each of the hold latches 40, 42 are funneled to the secondary I/O port 24 by way of the multiplexer 44 in a time division manner. The multiplexer gates one and only one output to the port 24 in response to the on or off condition of its gates 46, 48 and 50. The comparator controls the gates 46, 48 and 50. It continually monitors the output of the binary counter 56 and the fuse logic 58. The fuse logic 58 produces a code which reflects which of the columns and their respective bit lines have been replaced as being defective. Since the defective bit lines remain attached to the shift register 25 even after bit redundancy has been invoked, examining the fuse code in the fuse code logic 58 reveals which positions in shift register 25 have received meaningless data.

The binary counter 56 may be reset upon receipt of the READ/TRANSFER signal. Thus, when the READ/TRANSFER signal appears to cause the row buffer 25 to read out its contents, the binary counter 56 is reset and in response to the clock signals used to read out the row buffer, the binary counter begins to count to track the shift register position. The maximum count in the counter 56 should equal the size of the shift register. As long as the binary counters count and the fuse code in the fuse code logic 58 do not match the comparator will indicate to the multiplexer 44 to couple the shift register's output to the second I/O port. If bit redundancy has not been invoked, the binary counter and the fuse code in the fuse code logic 58 will never coincide and the second I/O port will always be connected to the output of the shift register 25.

If, however, bit redundancy has been invoked, the redundant hold latches 40, 42 will be storing needed data. There will be at least one relationship between the count stored in the counter 56 and the fuse code that will affect the comparator. Just prior to the arrival of the bad data at the output of the shift register 25, the count in binary counter 56 and the fuse code in the fuse code logic 58 will match. The comparator will interpret the match and will signal the multiplexer to switch the second port 24 to the proper redundant bit hold latch 40 or 42.

The second port to redundant bit latch configuration will be maintained until the next serial data bit appears at the output of the shift register 25. The shift register will purge itself of meaningless data by completing the shift operation and retrieve the next serial bit. The binary counter will increment so that there will no longer be a match between the fuse code and the count in the binary counter. The comparator will see this new relationship and signal the multiplexer to connect the output of the shift register to the second port 24.

Figure 4:
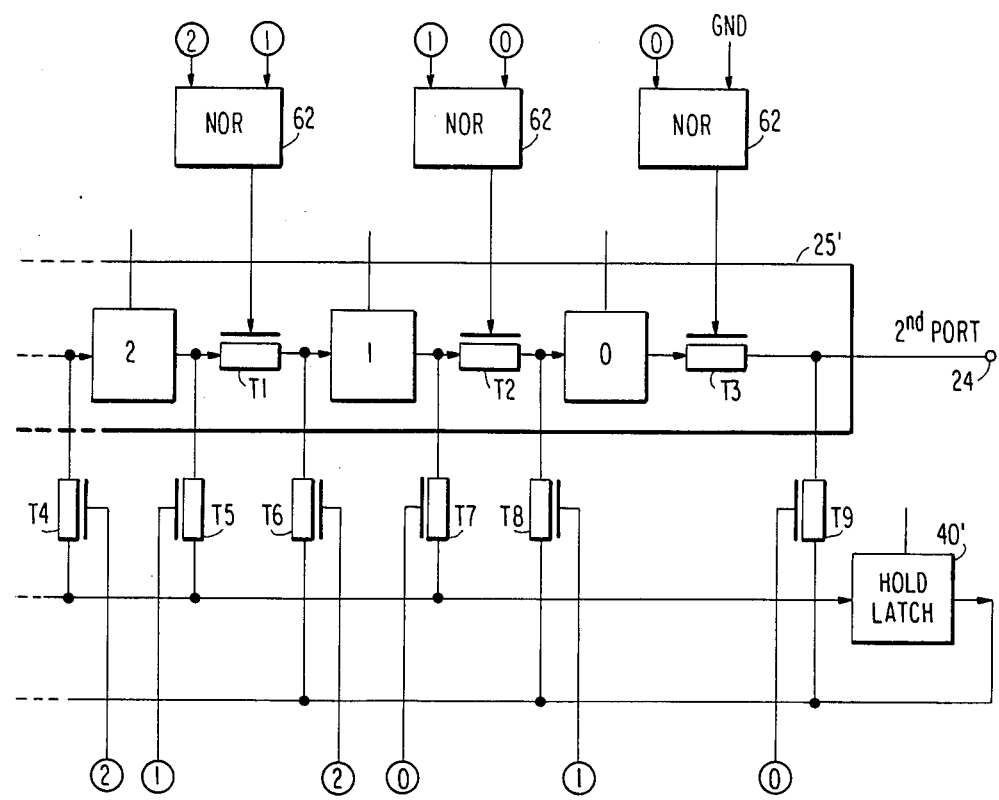
FIG. 4 illustrates a second embodiment of the control logic of the present invention.
Figure 4:
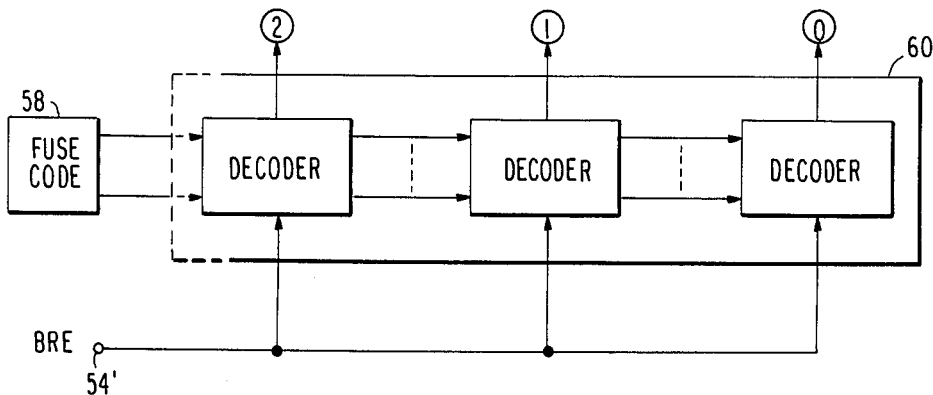

Another embodiment of the control logic 32 is depicted FIG. 4. In this embodiment, the row buffer shift register, only three stages of which are illustrated, is modified to include gating devices between the shift register stages. This modified shift register is identified by the numeral 25' in FIG. 4. The interstage gating device between stage 2 and stage 1 is illustrated as gate T1. Gate T2 is between stage 1 and stage 0, while gate T3 is between stage 0 and the port 24. In addition to the gating devices between each of the stages of the row buffer shift register, each stage has another gating device attached to its input and a gating device attached to its output, which gating devices are directly connected to a decoder circuit 60. The gating devices interconnecting adjacent stages of the register 25' are connected to the decoder 60 through a NOR circuit 62.

More specifically, FIG. 4 illustrates three of the 256 stages of the row buffer shift register 25', and the logic control circuit which includes a hold latch 40' connected to a redundant column and via a common bus and the gating circuits to the buffer register. The decoder 60 and its associated gating circuits which together operate to effectively remove a shift register stage connected to a defective column of the matrix 11 and insert in its place the hold latch 40, thereby maintaining the logical column addresses of the bit stream sequentially read from the buffer register 25'.

The decoder 60 is connected to the fuse code logic circuit 58 and to terminal 54' receiving the bit redundancy enable, BRE, signa. When a data bit is stored in a redundant column, the bit redundancy enable signal applied to terminal 54' causes the outputs of the decoder to identify the defective column in accordance with the fuse code. The decoder outputs ⓪ ① ② are connected to the corresponding terminals ⓪ ① ② connected to the NOR gates 62 and the gates T4–T9.

Assume register stage 2 is connected to a defective column and bit redundancy has been invoked. Terminal ② of decoder 60 goes high enabling gates T4 and T6 while disabling gates T1. This effectively places the hold latch 40' in the position of register stage 2. If the stage 1 is connected to a defective column, the terminal ① from the decoder 60 goes high disabling gates T1 and T2 while enabling gates T5 and T8 which effectively places the hold latch 40' in the position of the disabled shift register stage 1. Likewise, if stage 0 is connected to a defective column and redundancy has been invoked, terminal ③ of the decoder 60 goes high disabling gates T2 and T3 while enabling gates T7 and T9. Data is then shifted from the output of stage 1 through gate T7 and the hold latch 40' through gate T9 to the second port 24. Of course, the decoder 60 is provided with additional outputs to be connected to further gates connected to the other stages of the shift register 25' not illustrated in FIG. 4.

Thus, by the control logic of the present invention, redundancy can be used with a two port RAM featuring serial read out by physical column sequential accessing. In one embodiment of the control logic, redundancy control logic couples a redundant column register to the second I/O port using time division multiplexing. By switching the redundant data into the shift register bit stream at the time the data being replaced would appear, the required logical/physical relationship necessary for effective column redundancy in a display RAM is preserved. In a second embodiment of the redundancy control logic of the invention, a redundant shift register stage is provided along with logic which operates to couple the redundant shift register stage via a common bus to any selected shift register stage and is used to replace the normal shift register stage when the normal shift register stage is coupled to a defective column and when column redundancy is being used. This arrangement maintains the required logical/physical relationship for including column redundancy in a display RAM without using time division multiplexing.

What is claimed is:

1. A read/write memory system including a data storage matrix having columns and rows, write means responsive to column address signals for causing data bits to be stored in predetermined logical columns within the data storage matrix, each column address signal having a predetermined physical relationship to at least one column of the data storage matrix, said memory system having transfer means for transferring data bits between a plurality of columns of the data storage matrix and a memory input/output means, said data bits being transferred in parallel to or from the storage matrix serially through said memory input/output means in a sequence determined by the physical order of columns within the data storage matrix, the improvement comprising:
    a redundant data storage matrix having at least one column;
    a column redundancy means responsive to at least one predetermined column address signal for storing data bits in a column of the redundant data storage matrix; and
    control logic means, responsive to the column redundancy means and the transfer means, for causing data accessed from a redundant column to be presented to the memory input/output means in the sequential column position corresponding to the column address to which the column redundancy means is responsive;
    whereby the predetermined logical relationship between the column address and the columns in the data storage matrix is preserved when data bits are read from the memory system.

2. The read/write memory system of claim 1 wherein said control logic means further includes means for causing data bits serially transferred through said memory input/output means from outside said memory to be written to columns of said data storage matrix and said redundant data storage matrix in accordance with said predetermined column address signal, whereby the predetermined logical to physical relationship between the column address and the columns in the data storage matrix is preserved when data bits are serially written in through the memory input/output system.

3. The read/write memory system of claim 1 wherein said control logic means comprises time division multiplexing means for presenting a data bit accessed from a redundant column to said memory input/output means in a time division manner according to its logical column address.

4. The read/write memory system of claim 2 wherein said time division multiplexing means includes means for monitoring the identity of the data storage matrix physical columns corresponding the data bits sequentially presented to the memory input/output means during serial read out, and multiplexing means responsive to said monitoring means for preventing said transfer means from presenting to said input/output means a data bit from a column of the data storage matrix having the predetermined physical relationship with the column address to which the column redundancy means is responsive, and for presenting to said input/output means in its place the data bit from the redundant data storage matrix stored therein in response to said column address to which said column redundancy means is responsive.

5. The read/write memory system of claim 4 wherein said monitoring means comprises:
    counter means for providing a count identifying the physical column of the data storage matrix which stored the data bit being presented to the memory input/output means;
    code storing means for storing a code corresponding to the count identifying a column of the data storage matrix having the predetermined physical relationship to the column address to which said column redundancy means in responsive, and comparator means responsive to an output of said counter means and an output of said code storing means for detecting when the count in said counter matches a code stored in said code storing means, said multiplexer means including means responsive to the detection of said match for preventing read out to said input/output means of a data bit from the physical column of the data storage matrix which corresponds to said code in said code storing means and for reading out to said input/output means a data bit stored in the redundant column addressed by the column address which corresponds to said code stored in said code storing means.

6. The read/write memory system of claim 5 wherein said transfer means includes a row buffer serial shift register for receiving data bits, the stages of said shift register being electrically connected to predetermined columns of the data storage matrix, and wherein said control logic includes at least one latch means for receiving data bits from said at least one column of said redundant data storage matrix, said multiplexer means being connected to receive the serial output of said row buffer serial shift register and to said latch means.

7. The read/write memory system of claim 1 wherein said transfer means comprises a row buffer serial shift register transferring data bits to or from columns of said data storage matrix, the stages of said shift register being electrically connected to predetermined columns of the data storage matrix; and said control logic means comprises, at least one latch means for storing a data bit having said predetermined column address to which said column redundancy means is responsive, gating means for selectively causing data bits sequentially transferred through said shift register to by-pass the register stage connected to the column of the data storage matrix having the predetermined physical relationship to the column address to which the column redundancy means is responsive and for causing the data bits to instead pass through said latch means, said latch means appearing to said data bits to be in the physical position of said by-passed shift register stage, and decoder means responsive to the column address to which said column redundancy means is responsive for enabling said gating means.

8. A read/write memory system including a data storage matrix having columns and rows, write means responsive to column address signals for causing data bits to be stored in predetermined logical columns within data storage matrix, each column address defining a predetermined logical to physical relationship between the logical column defined by the column address and a physical column of the data storage matrix, said memory system having transfer means for transferring data bits between a plurality of physical columns of said data storage matrix and a data input/output means, said data bits being transferred in parallel to or from said data storage matrix and serially through said data input/output means in a sequence corresponding to the logical column order determined by said column address signals, the improvement comprising:

a redundant data storage matrix having at least one column;

a column redundancy means responsive to at least one predetermined column address signal for storing data bits in a column of the redundant data storage matrix; and for signalling that column redundancy has been selected; and control logic means, responsive to the column redundancy means and said transfer means, for causing data bits sequentially transferred through said data input/output means and having respective predetermined corresponding logical column positions to maintain their respective logical column positions during both reading and writing of data bits from and to said storage matrix when column redundany has been selected.

* * * * *